United States Patent [19]
Seki

[11] Patent Number: 5,122,692
[45] Date of Patent: Jun. 16, 1992

[54] HIGH SPEED LEVEL CONVERSION CIRCUIT INCLUDING A SWITCH CIRCUIT

[75] Inventor: Teruo Seki, Kasugai, Japan

[73] Assignees: Fujitsu Limited; Fujitsu VLSI Limited, both of Japan

[21] Appl. No.: 645,445

[22] Filed: Jan. 24, 1991

[30] Foreign Application Priority Data

Jan. 25, 1990 [JP] Japan .................. 2-015251

[51] Int. Cl.$^5$ .......................... H03K 19/086
[52] U.S. Cl. .................... 307/475; 307/451; 307/446; 307/443; 307/448
[58] Field of Search ............... 307/475, 451, 446, 448, 307/443

[56] References Cited

U.S. PATENT DOCUMENTS

| | | | |
|---|---|---|---|
| 4,191,898 | 3/1980 | Ulmer | 307/475 |
| 4,356,409 | 10/1982 | Masuda et al. | 307/475 |
| 4,504,747 | 3/1985 | Smith et al. | 307/446 |
| 4,698,527 | 10/1987 | Matsumoto | 307/475 |
| 4,849,659 | 7/1989 | West | 307/475 |
| 4,879,681 | 11/1989 | Miwa et al. | 365/189.05 |
| 4,945,258 | 7/1990 | Piccard et al. | 307/475 |
| 4,984,202 | 1/1991 | Kawahara et al. | 365/177 |

FOREIGN PATENT DOCUMENTS

62-104314 5/1987 Japan .
1-132215 5/1989 Japan .

Primary Examiner—Stanley D. Miller
Assistant Examiner—Scott A. Ouellette
Attorney, Agent, or Firm—Armstrong, Nikaido, Marmelstein, Kubovcik & Murray

[57] ABSTRACT

An input signal is received by a level shift circuit to generate a plurality of level-shifted output signals which have different shift amounts to each other. A switch circuit, selectively outputs the level-shifted output signals in response to a logic level of the input signal. The switch circuit selects a signal having a higher potential from the level-shifted output signals when the logic level of the input signal indicates a first level, and selects a signal having a lower potential from the level-shifted output signals when the logic level of the input signals indicates a second level.

8 Claims, 7 Drawing Sheets

HIGH SPEED LEVEL CONVERSION CIRCUIT INCLUDING A SWITCH CIRCUIT

BACKGROUND OF THE INVENTION

1) Field of the Invention

The present invention relates to a level conversion circuit for converting binary logic signals having a certain amplitude into binary logic signals having another amplitude.

2) Description of the Related Art

Generally, since digital circuit elements have a general purpose, a so-called standard logic is predetermined for the digital circuit elements. As the standard logic, there are emitter-coupled logic (ECL) having an amplitude of about 1 V, transistor-transistor logic (TTL) having an amplitude of about 1 V, CMOS logic having an amplitude of about 2 V, and the like. Therefore, a logic level conversion is required in signal transmission between different standard logic levels, and a level conversion circuit is used for that purpose.

In a prior art level conversion circuit, binary logic input signals having an amplitude are received by two input transistors, and the potentials of the binary logic input signals are shifted down by diodes. Then, the level-shifted binary logic signals are supplied to a differential amplifier, thereby obtaining binary logic output signals having another amplitude, which will be explained later in detail.

In the prior art, however, the differential amplifier cannot operate at high speed unless a large current is supplied thereto. Therefore, the prior art level conversion circuit having high speed of operation also has a large power consumption.

Also, in the prior art, various levels of binary logic output signals cannot be generated.

SUMMARY OF THE INVENTION

Therefore, an object of the present invention is to provide a level conversion circuit having reduced power consumption and being capable of easily generating various levels of binary logic output signals.

According to the present invention, a input signal is received by a level shift circuit to generate a plurality of level-shifted output signals which have different shift amounts to each other. A switch circuit, selectively outputs the level-shifted output signals in response to a logic level of the input signal. The switch circuit selects a signal having a higher potential from the level-shifted output signals when the logic level of the input signal indicates a first level, and selects a signal having a lower potential from the level-shifted output signals when the logic level of the input signal indicates a second level.

In the present invention, the switch is used instead of the differential amplifier, thus reducing the power consumption. Also, the number of stages of the level shift circuit can be changed to generate various levels of binary logic output signals.

BRIEF DESCRIPTION OF THE DRAWINGS

The present invention will be more clearly understood with reference to the accompanying drawings, wherein.

DESCRIPTION OF THE PREFERRED EMBODIMENT

Before the description of an embodiment, a prior art level conversion circuit will be explained in detail.

Figure 1:
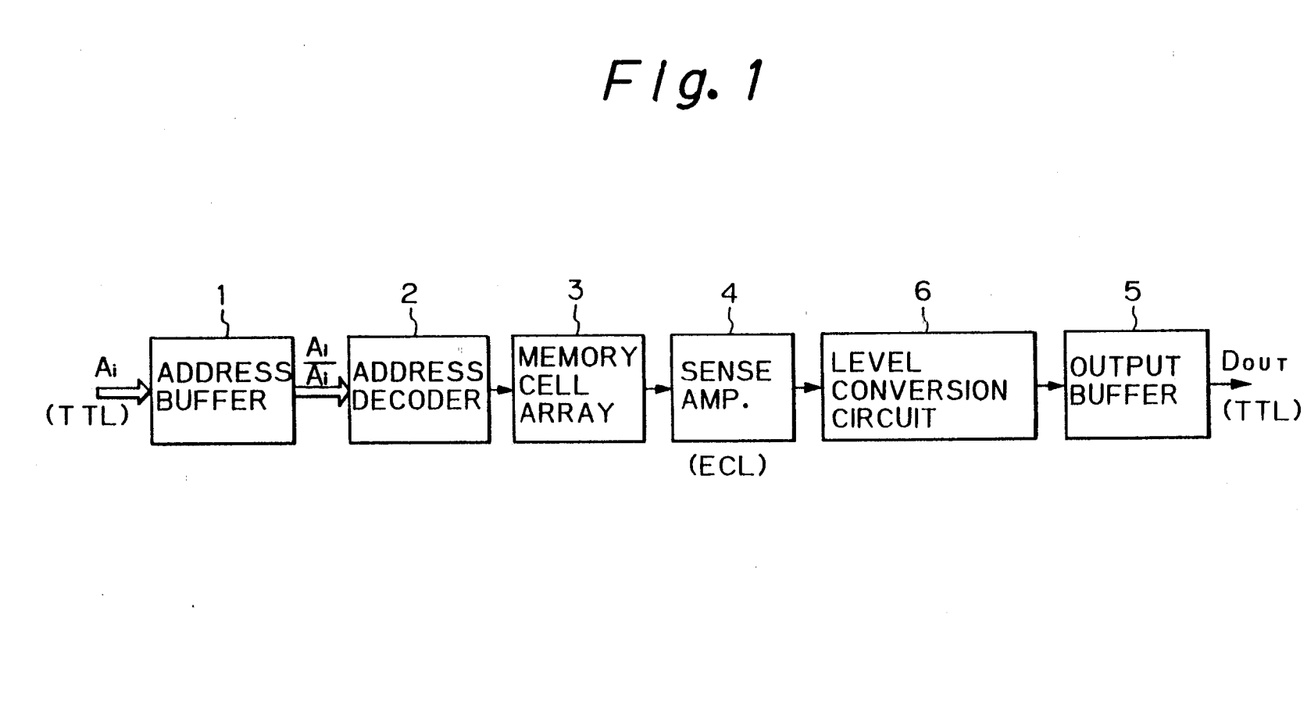
FIGS. 1 and 2 are block circuit diagrams illustrating memory devices including a level conversion circuit.

In FIG. 1, which illustrates a bipolar complementary MOS (BiCMOS) static random access memory, a TTL level signal is input and a TTL level signal is output. In FIG. 1, reference numeral 1 designates an address buffer which receives address signals Ai (i=0, 1, 2, . . . ) of a TTL level from 0.5 V to 1.5 V to generate signals Ai and their inverted signals $\overline{Ai}$. The signals $\overline{Ai}$ and Ai are decoded by an address decoder 2 which accesses, i.e., reads one cell from a memory cell array 3. Data read from the memory cell array 3 is sensed by a sense amplifier 4. Although the sensed data is output as output data $D_{OUT}$ from an output buffer 5, a level conversion circuit 6 is required therebetween. That is, the sense amplifier 4 is operated at an ECL level, while the output buffer 5 is operated at a TTL level. Therefore, the ECL level in the sense amplifier 4 is converted by the level conversion circuit 6 to the TTL level.

Figure 2:
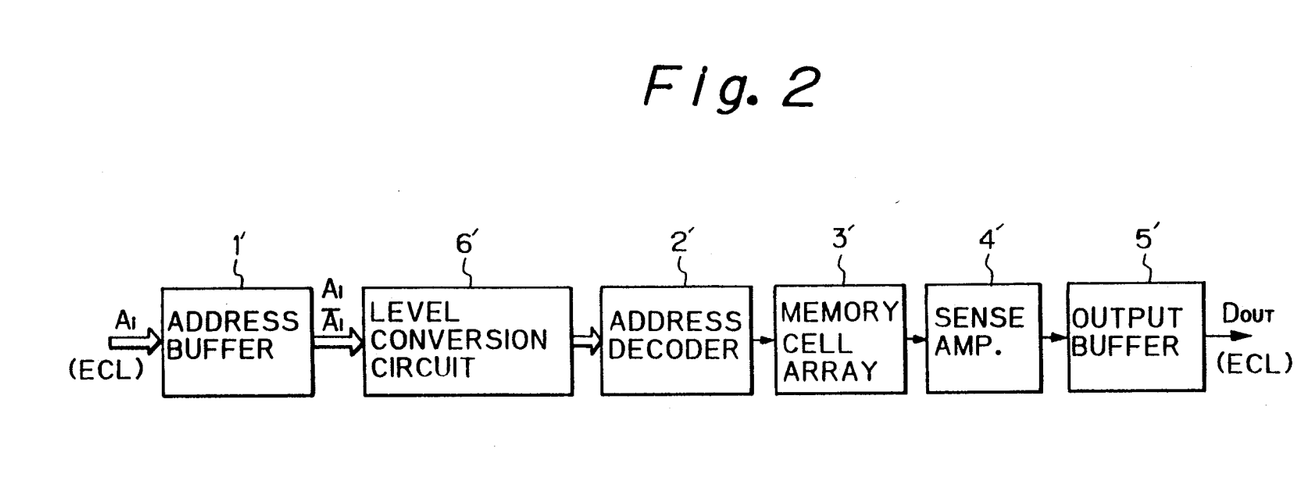

Although FIG. 2 also illustrates a BiCMOS static random access memory, an ECL level signal is input and an ECL level signal is output. In FIG. 2, reference numeral 1' designates an address buffer for receiving an ECL level address signal Ai (i=0, 1, 2, ...) to generate signals Ai and their inverted signal $\overline{Ai}$. 2' designates an address decoder, 3' a memory cell array, 4' a sense amplifier, 5' an output buffer. In this case, the signals in the address buffer 1' are at an ECL level, while the signals in the address decoder 2' are at a CMOS level. Therefore, a level conversion circuit 6' is required between the address buffer 1' and the address decoder 2'.

Figure 3:
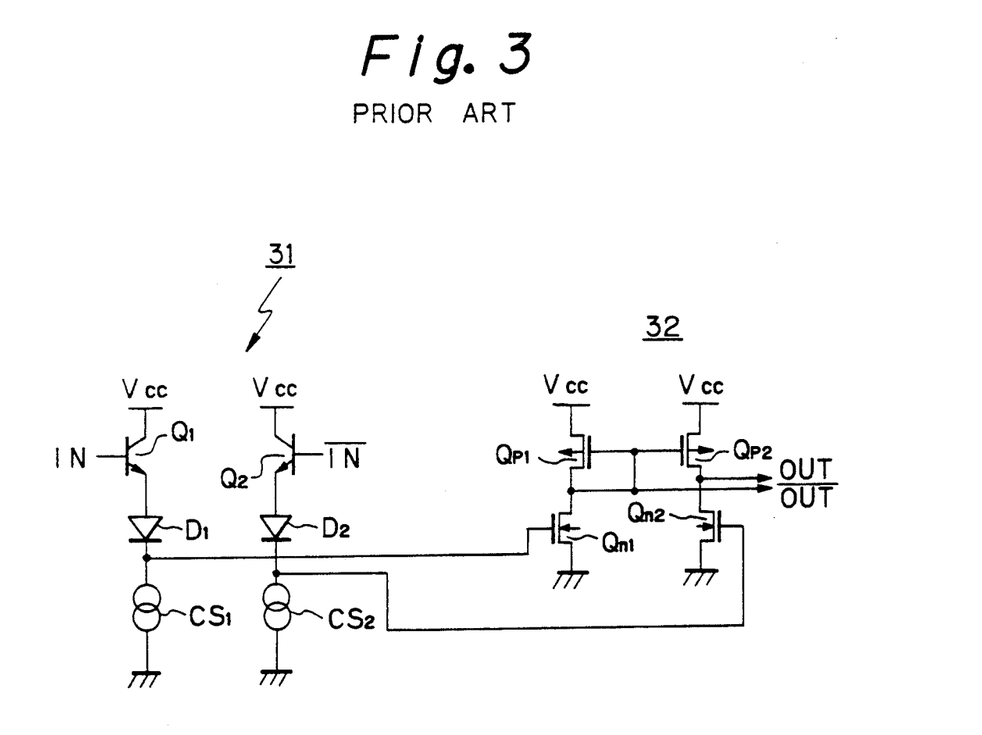
FIG. 3 is a circuit diagram illustrating a prior art level conversion circuit.

In FIG. 3, which illustrates a prior art level conversion circuit for converting an ECL level having an amplitude of about 1 V to a CMOS level having an amplitude of about 2 V, the level conversion circuit is formed by a level shift circuit 31 and a CMOS current mirror differential amplifier 32.

The level shift circuit 31 includes input bipolar transistors $Q_1$ and $Q_2$, level shift diodes $D_1$ and $D_2$, and current sources $CS_1$ and $CS_2$. Applied to the bases of the transistors $Q_1$ and $Q_2$ are input signals IN and $\overline{IN}$ having ECL levels opposite to each other and having a level difference of about 1 V (for example, IN=5 V and $\overline{IN}$=4.2 V). The ECL input level of the input signals IN and $\overline{IN}$ is dropped by 0.7 V due to the base-emitter voltage $V_{be}$ of the transistor $Q_1$ and 0.7 V of the diode $D_1$ and is supplied to the differential amplifier 32.

The differential amplifier 32 has P-channel MOS (broadly, MIS) transistors $Q_{p1}$ and $Q_{p2}$ and N-channel MOS transistors $Q_{n1}$ and $Q_{n2}$. Applied to the gates of the MOS transistors $Q_{n1}$ and $Q_{n2}$ are output signals from the level shift circuit 31. The drains of the transistors $Q_{n1}$ and $Q_{n2}$ generate output signals $\overline{OUT}$ and OUT whose potentials are, for example, 2 V and 3 V, respectively. If the input level of the differential amplifier 32 is not at an intermediate level between the power supply $V_{cc}$ such as 5 V and ground $V_{ss}$ such as 0 V, the operation speed is low. That is, if the input level is too high, a discharging current from the next stage such as the address buffer 2' of FIG. 2 is too large due to the ON-transistor $Q_{n1}$ or $Q_{n2}$, while a charging current by the transistor $Q_{p1}$ or $Q_{p2}$ to the next stage is too small. Conversely, the level is too low, a discharging current from the next stage is too small due to the ON-transistor $Q_{n1}$ or $Q_{n2}$, while a charging current from the transistor $Q_{p1}$ or $Q_{p2}$ to the next stage is too large. Both of the above-mentioned cases invites a low speed operation. Thus, the input level is shifted down by the diodes $D_1$ and $D_2$ to input to the differential amplifier 32.

Further, even if the input level of the differential amplifier 32 is appropriately at an intermediate level between $V_{cc}$ and $V_{ss}$, in order to further increase the speed of operation, the total current flowing through the differential amplifier 32 as well as the total current flowing through the level shift circuit 31 has to be increased, to thereby increase the charging current to the next stage.

Also, one of the input signals IN and $\overline{IN}$ is high, one of the transistors $Q_{n1}$ and $Q_{n2}$ is turned ON and therefore, a current path is always created between $V_{cc}$ and $V_{ss}$, thus increasing the power consumption.

Further, the output difference (MOS level difference in the above-mentioned example) cannot be easily obtained at an arbitrary level. That is, if $\Delta V_{IN}$ is an input difference to the differential amplifier 32 and $\Delta V_{OUT}$ is an output difference to the differential amplifier 32, $$\Delta V_{OUT} = \alpha \cdot \Delta V_{IN}$$

where $\alpha$ is an amplification factor of the differential amplifier 32. Therefore, the output difference $\Delta V_{OUT}$ dependent only upon $\Delta V_{IN}$ cannot be obtained at an arbitrary level.

Figure 4:
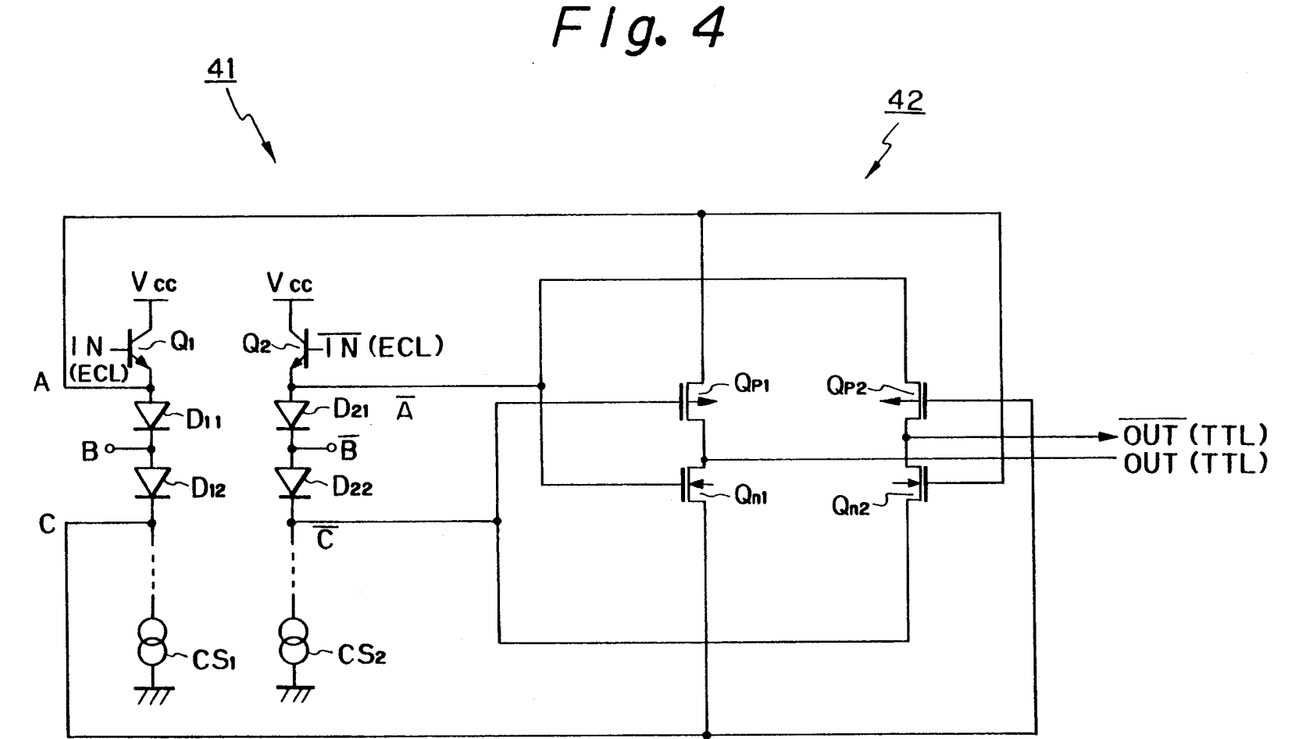
FIG. 4 is a circuit diagram illustrating an embodiment of the level conversion circuit according to the present invention.

In FIG. 4, which illustrates an embodiment of the level conversion circuit according to the present invention, reference numeral 41 designates a level shift circuit and 42 designates a switch circuit.

Figure 5:
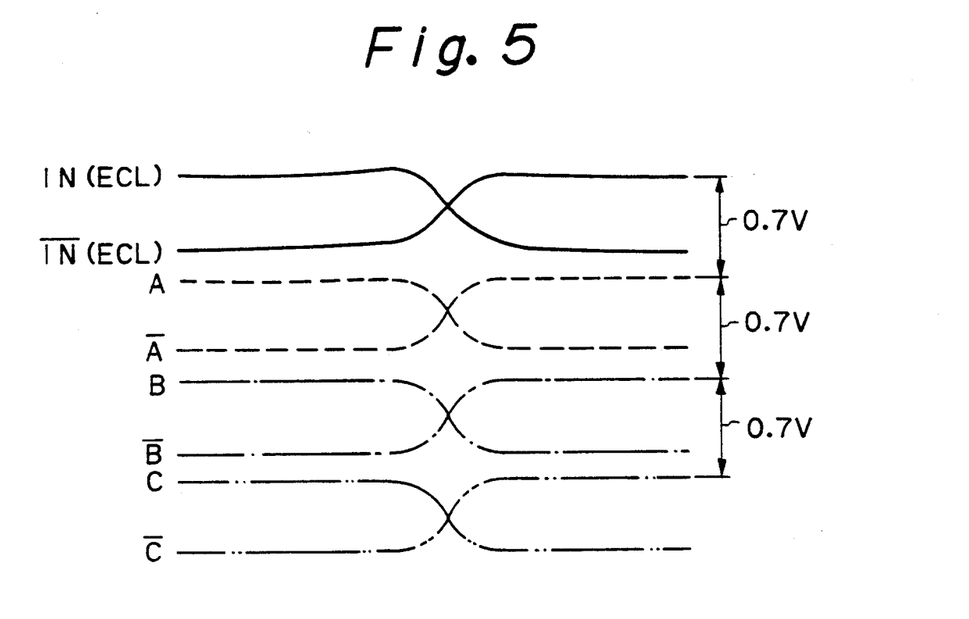
FIGS. 5 and 6 are timing diagrams showing the operation of the circuit of FIG. 4.

The level shift circuit 41 includes input bipolar transistors $Q_1$ and $Q_2$, level shift diodes $D_{11}$, $D_{12}$, ..., $D_{21}$, $D_{22}$, ..., and current sources $CS_1$ and $CS_2$. In this level shift circuit 41, as shown in FIG. 5, the input signals In and $\overline{IN}$ having a first level amplitude are applied to the bases of the transistors $Q_1$ and $Q_2$, the potentials of the input signals IN and $\overline{IN}$ are level-shifted by the base-emitter voltage $V_{be}$ of the transistors $Q_1$ and $Q_2$, to obtain the potentials at nodes A and $\overline{A}$. Also, the potentials of the signals A and $\overline{A}$ are level-shifted by one stage of the diodes $D_{11}$ and $D_{21}$, to obtain the potentials at nodes B and $\overline{B}$. Further, the potentials of the signals B and $\overline{B}$ are level-shifted by one stage of the diodes $D_{12}$ and $D_{22}$, to obtain the potentials at nodes C and $\overline{C}$.

On the other hand, the switch circuit 42 includes a pair of transistors comprising P-channel MOS transistor $Q_{p1}$ and N-channel MOS transistor $Q_{n1}$, and a pair of transistors comprising P-channel MOS transistor $Q_{p2}$ and N-channel MOS transistor $Q_{n2}$. The pair of transistors comprising P-channel MOS transistor $Q_{p1}$ and N-channel MOS transistor $Q_{n1}$ are connected between nodes A and C, and therefore, the transistors $Q_{p1}$ and $Q_{n1}$ are powered by the potentials at nodes A and C. Also, the gates of the transistors $Q_{p1}$ and $Q_{n1}$ are connected to nodes $\overline{C}$ and $\overline{A}$, respectively, and therefore, the transistors $Q_{p1}$ and $Q_{n1}$ are controlled by the potentials at nodes $\overline{C}$ and $\overline{A}$, respectively. Similarly, the pair of transistors comprising P-channel MOS transistor $Q_{p2}$ and N-channel MOS transistor $Q_{n2}$ are connected between nodes $\overline{A}$ and $\overline{C}$, and therefore, the transistors $Q_{p2}$ and $Q_{n2}$ are powered by the potentials at nodes $\overline{A}$ and $\overline{C}$. Also, the gates of the transistors $Q_{p2}$ and $Q_{n2}$ are connected to nodes C and A, respectively, and therefore, the transistors $Q_{p2}$ and $Q_{n2}$ are controlled by the potentials at nodes C and A, respectively.

Figure 6:
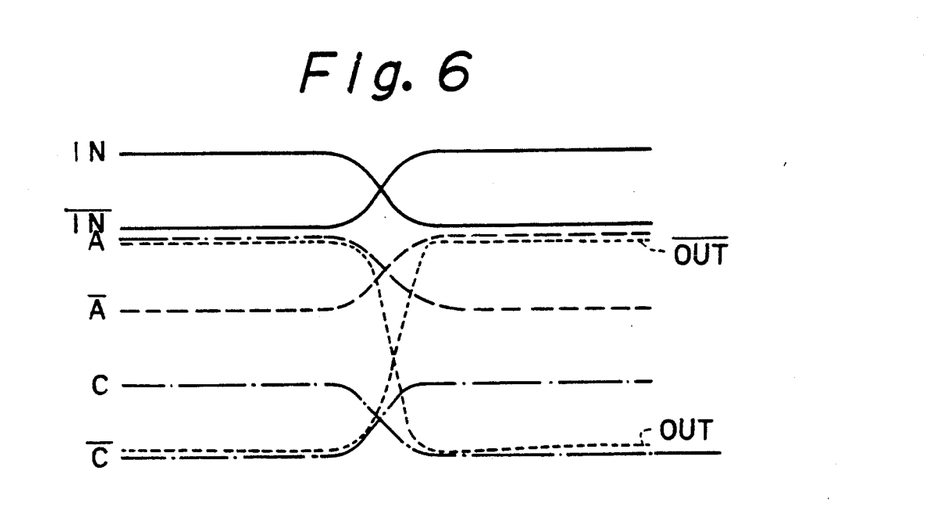

When the potentials of the input signals IN and $\overline{IN}$ are high and low, respectively, the P-channel MOS transistor $Q_{p1}$ and the N-channel MOS transistor $Q_{n2}$ are turned ON and the P-channel MOS transistor $Q_{p2}$ and the N-channel MOS transistor $Q_{n1}$ are turned OFF. As a result, the potential at the output terminal OUT is the same as that at node A, and the potential at the output terminal $\overline{OUT}$ is the same as that at node $\overline{C}$. In this case, the amplitude of the output terminals OUT and $\overline{OUT}$ is A - $\overline{C}$, as shown in FIG. 6.

Similarly, when the potentials of the input signals IN and $\overline{IN}$ are low and high, respectively, the P-channel MOS transistor $Q_{p2}$ and the N-channel MOS transistor $Q_{n1}$ are turned ON and the P-channel MOS transistor $Q_{p1}$ and the N-channel MOS transistor $Q_{n2}$ are turned OFF. As a result, the potential at the output terminal OUT is the same as that at node C, and the potential at the output terminal $\overline{OUT}$ is the same as that at node $\overline{A}$. In this case, the amplitude of the output terminals OUT and $\overline{OUT}$ is $\overline{A}$- C, as shown in FIG. 6.

In a stationary state, one of the transistors $Q_{p1}$ and $Q_{n1}$, and one of the transistors $Q_{p2}$ and $Q_{n2}$ are turned OFF, and therefore, there is no power consumption. Therefore, since power is consumed only in the level shift circuit 41, the operation current can be reduced to suppress the power consumption. Also, a level conversion at an arbitrary level can be easily carried out only by changing the number of stages of diodes. That is, when the connections between the level shift circuit 41 and the switch circuit 42 are changed, various level binary output signals can be obtained.

Figure 7:
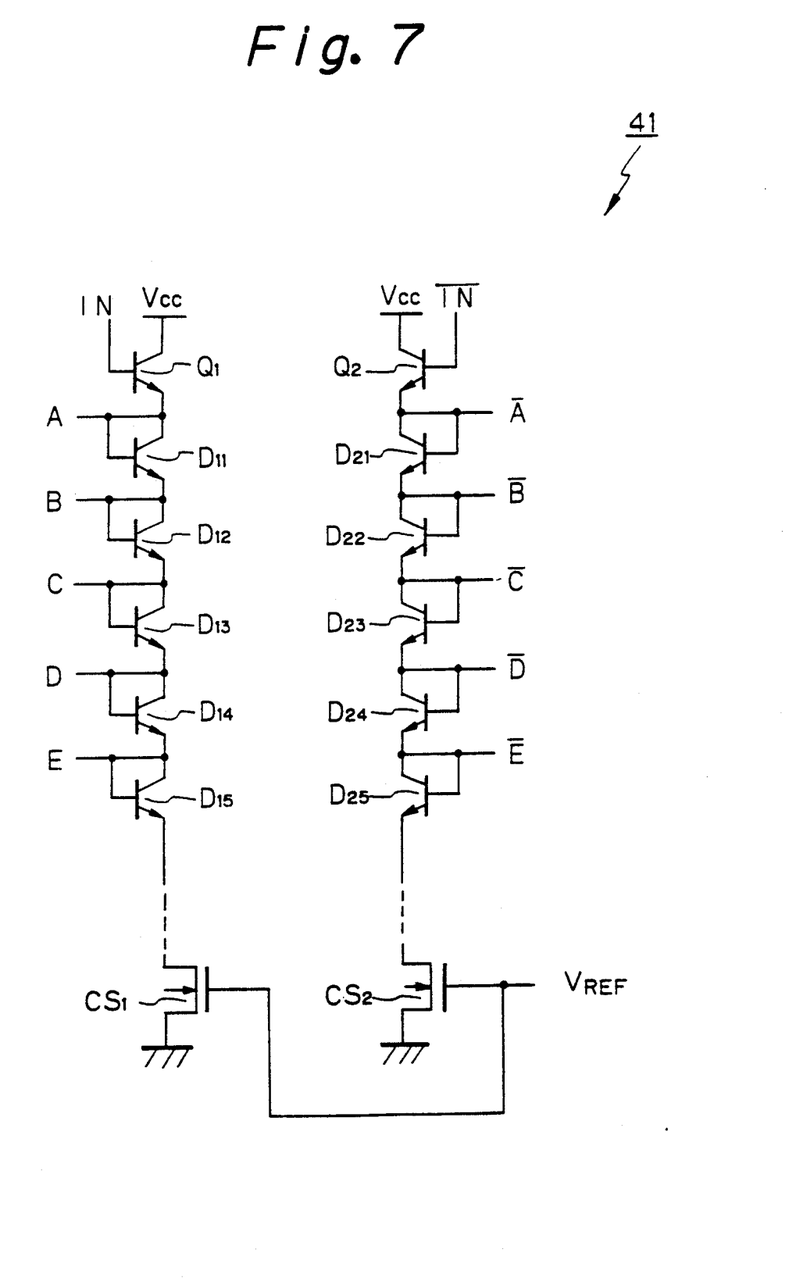
FIG. 7 is a detailed circuit diagram of the level shift circuit of FIG. 4.

In FIG. 7, which is a detailed circuit diagram of the level shift circuit 41 of FIG. 4, the diodes $D_{11}$, $D_{12}$, ..., $D_{21}$, $D_{22}$, ... are constructed by base-collector-connected bipolar transistors, and the current sources $C_{S1}$ and $C_{S2}$ are constructed by N-channel MOS transistors whose gates receive a definite volta $V_{REF}$ such as 2V.

Figure 8:
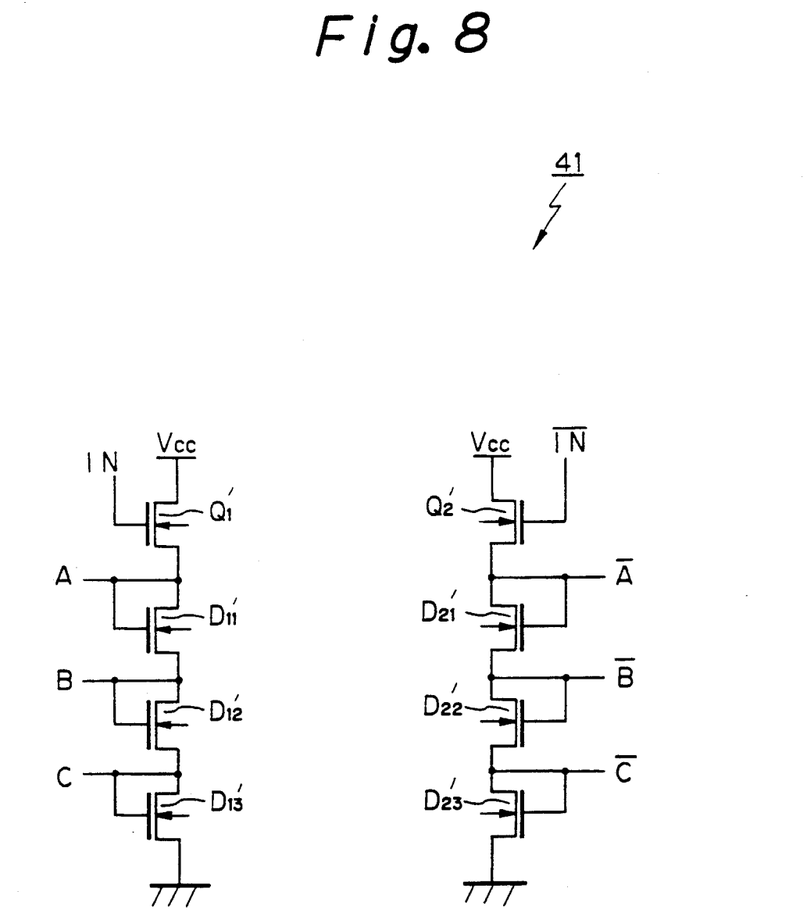
FIG. 8 is a circuit diagram of a modification of the level shift circuit of FIG. 7.

In FIG. 8, which is a modification of the circuit of FIG. 7, the level shift circuit 41 includes two input N-channel MOS transistors $Q_1'$ and $Q_2'$, and diodes $D_{11}'$, $D_{12}'$, ..., $D_{21}'$, $D_{22}'$, ... which are formed by gate-drain connected N-channel MOS transistors. In this case, no current sources are necessary.

The level shift circuit 41 as illustrated in FIG. 8 can operate in the same way as the level shift circuit 41 as illustrated in FIG. 7.

According to the present invention, since the switch circuit has very low power consumption, the operation current can be reduced to suppress the power consumption, and level conversion at an arbitrary level can be easily carried out at high speed.

I claim:

1. A level conversion circuit comprising:
   a first power supply terminal;
   a second power supply terminal; p1 a level shift circuit, connected between said first and second power supply terminals, said level shift circuit including
   a pair of input transistors, connected to said first power terminal, for receiving input signals, and first and second series of level shift elements. connected between said input transistors and said second power supply terminal, said first and second series of level shift elements each generating two kinds of level-shifted output signals which have different shift amounts with respect to each other; and a switch circuit, connected to said level shift circuit, said switch circuit inducing a switching element which is powered by two signals of one of said kinds of level-shifted signals and is controlled by two of the other of said kinds of level-shifted output signals, said switch circuit generating an output signal in response to said input signals.

2. A circuit as set forth in claim 1, wherein said switch circuit further includes another switching element which is powered by two signals of the other of said kinds of level-shifted output signals and is controlled by two of the one of said kinds of level-shifted output signals, said switch circuit generating another output.

3. A circuit as set forth in claim 2, wherein said input signals are binary complementary logic signals having a first amplitude and an inverted relationship to each other, and said output signals are binary complementary logic signals having a second amplitude and an inverted relationship to each other.

4. A circuit as set forth in claim 2, wherein each of said input transistors comprises a bipolar transistor having a collector connected to said first power supply terminal, a base for receiving one of said binary logic input signals, and an emitter connected to one of said first and second series of level shift elements.

5. A circuit as set forth in claim 2, wherein each of said input transistors comprises a MIS transistor having a drain connected to said first power supply terminal, a gate for receiving one of said binary logic input signals, and a source connected to one of said first and second series of level shift elements.

6. A circuit as set forth in claim 2, wherein each of said level shift elements comprises a gate-collector-connected bipolar transistor, said circuit further comprising two current sources each connected between one of said first and second series of level shift elements and said second power supply terminal.

7. A circuit as set forth in claim 2, wherein each of said level shift transistors comprises a gate-drain-connected MIS transistor.

8. A circuit as set forth in claim 2, wherein said switch circuit comprises a first pair of transistors comprising P-channel MIS transistor and N-channel MIS transistor connected in series between two connection points of said first series of level shift elements; and a second pair of transistors comprising P-channel MIS transistor and N-channel MIS transistor connected in series between two connection points of said second level shift elements, said first pair of P-channel MIS transistor and N-channel MIS transistor being controlled by potentials at said two connection points of said second series of level shift elements. respectively, said second pair of P-channel MIS by potentials at said two connection points of said first series of level shift elements, respectively, the connection points of said first and second pairs of P-channel MIS transistor and N-channel MIS transistor generating said binary logic output signals.

* * * * *